(12) United States Patent
Nielsen

(10) Patent No.: US 11,121,681 B2
(45) Date of Patent: Sep. 14, 2021

(54) BIAS CIRCUITRY

(71) Applicant: Qorvo International PTE. LTD., Singapore (SG)

(72) Inventor: Michael Nielsen, Vodskov (DK)

(73) Assignee: Qorvo International PTE. LTD., Singapore (SG)

(*) Notice: Subject to any disclaimer, the term of this patent is extended or adjusted under 35 U.S.C. 154(b) by 0 days.

(21) Appl. No.: 16/835,575

(22) Filed: Mar. 31, 2020

(65) Prior Publication Data

US 2020/0350876 A1 Nov. 5, 2020

Related U.S. Application Data

(60) Provisional application No. 62/842,817, filed on May 3, 2019.

(51) Int. Cl.
| | |
|---|---|
| *H03F 1/30* | (2006.01) |
| *H03F 3/195* | (2006.01) |
| *H03F 1/02* | (2006.01) |
| *H03F 3/24* | (2006.01) |
| *H03F 1/56* | (2006.01) |
| *H03F 1/52* | (2006.01) |

(52) U.S. Cl.
CPC .......... *H03F 3/195* (2013.01); *H03F 1/0216* (2013.01); *H03F 1/0261* (2013.01); *H03F 1/302* (2013.01); *H03F 1/52* (2013.01); *H03F 1/56* (2013.01); *H03F 3/245* (2013.01); *H03F 2200/222* (2013.01); *H03F 2200/387* (2013.01); *H03F 2200/451* (2013.01); *H03F 2200/555* (2013.01)

(58) Field of Classification Search
CPC ........................................................ H03F 1/30

USPC .................................................. 330/296, 285
See application file for complete search history.

(56) References Cited

U.S. PATENT DOCUMENTS

| | | | |
|---|---|---|---|
| 7,038,546 B2* | 5/2006 | Kuriyama | H03G 1/0082 330/133 |
| 2008/0042742 A1* | 2/2008 | Linder | H03F 1/22 327/562 |
| 2011/0043287 A1* | 2/2011 | Chen | H03F 3/195 330/296 |

* cited by examiner

*Primary Examiner* — Henry Choe
(74) *Attorney, Agent, or Firm* — Withrow & Terranova, PLLC

(57) ABSTRACT

Bias circuitry is disclosed with a bias drive device having a first current terminal coupled to a voltage supply node, a bias control terminal coupled to a control node, and a second current terminal coupled to a bias output node. An impedance control device has a third current terminal and an impedance control terminal that are coupled together and a fourth current terminal coupled to ground. An output impedance resistor is coupled between the third current terminal and the bias output node. A pull-down device is coupled between the bias output node and the fixed voltage node, wherein a higher voltage applied to the control node sets an output impedance at the bias output node to approximately a lower impedance of the pull-down device and a lower voltage applied to the control node sets the output impedance to approximately the resistance of the output impedance resistor.

20 Claims, 4 Drawing Sheets

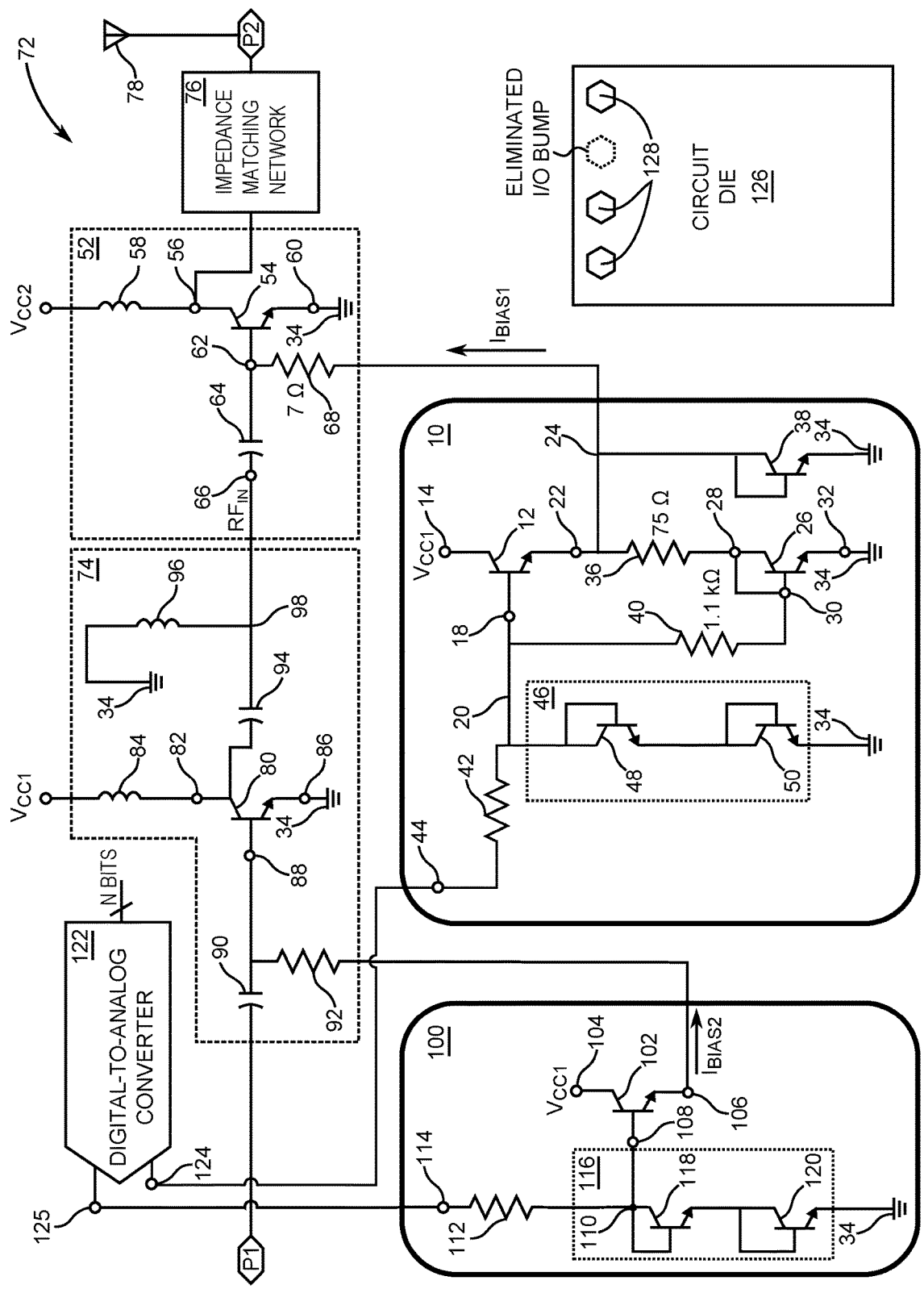

BIAS CIRCUITRY

RELATED APPLICATIONS

This application claims the benefit of provisional patent application Ser. No. 62/842,817, filed May 3, 2019, the disclosure of which is hereby incorporated herein by reference in its entirety.

FIELD OF THE DISCLOSURE

The present disclosure relates to radio frequency linear power amplifiers and particularly relates to bias circuitry for such amplifiers.

BACKGROUND

Proper bias of a radio frequency power amplifier is important for the proper operation of the radio frequency power amplifier. Both linearity and gain depend strongly on the quiescent current of transistors making up the radio frequency amplifier. For large signal operation, output impedance of bias circuitry providing quiescent current to bias the radio frequency amplifier at direct current modulation bandwidth also has substantial influence over linearity.

Typically, a designer selects output impedance of the bias circuitry that is relative low to promote linearity at maximum output power. This is because maximum power linearity is typically a specification that is most difficult to meet. For a practical radio frequency power amplifier it is possible to meet linearity at low power; however, the quiescent current needs to be higher than it would typically be with a higher output impedance. Because gain increases with quiescent current, this forces the designer to implement a gain reduction circuit or alternatively to use a dedicated low power radio frequency power amplifier. Either of these solutions takes up valuable circuit real estate and therefore increases the cost of radio frequency power amplifier systems. Thus, there remains a need for bias circuitry for radio frequency power amplifiers that reduces circuit real estate and cost.

SUMMARY

Bias circuitry is disclosed with a bias drive device having a first current terminal coupled to a first voltage supply node, a bias control terminal coupled to a control node, and a second current terminal coupled to a bias output node. An impedance control device has a third current terminal and an impedance control terminal that are coupled together and a fourth current terminal coupled to a fixed voltage node. An output impedance resistor is coupled between the third current terminal and the bias output node. A pull-down device is coupled between the bias output node and the fixed voltage node, wherein a higher voltage applied to the control node sets an output impedance at the bias output node to approximately equal to a lower impedance of the pull-down device in parallel with the bias drive device, and a lower voltage applied to the control node sets the output impedance to approximately equal to the resistance of the output impedance resistor.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 4 is a schematic of an exemplary radio frequency power amplifier system that employs the bias circuitry of the present disclosure.

FIG. 5 depicts a circuit die that offers an advantage of the bias circuitry providing a reduced physical size for the radio frequency power amplifier system.

DETAILED DESCRIPTION

Figure 1:
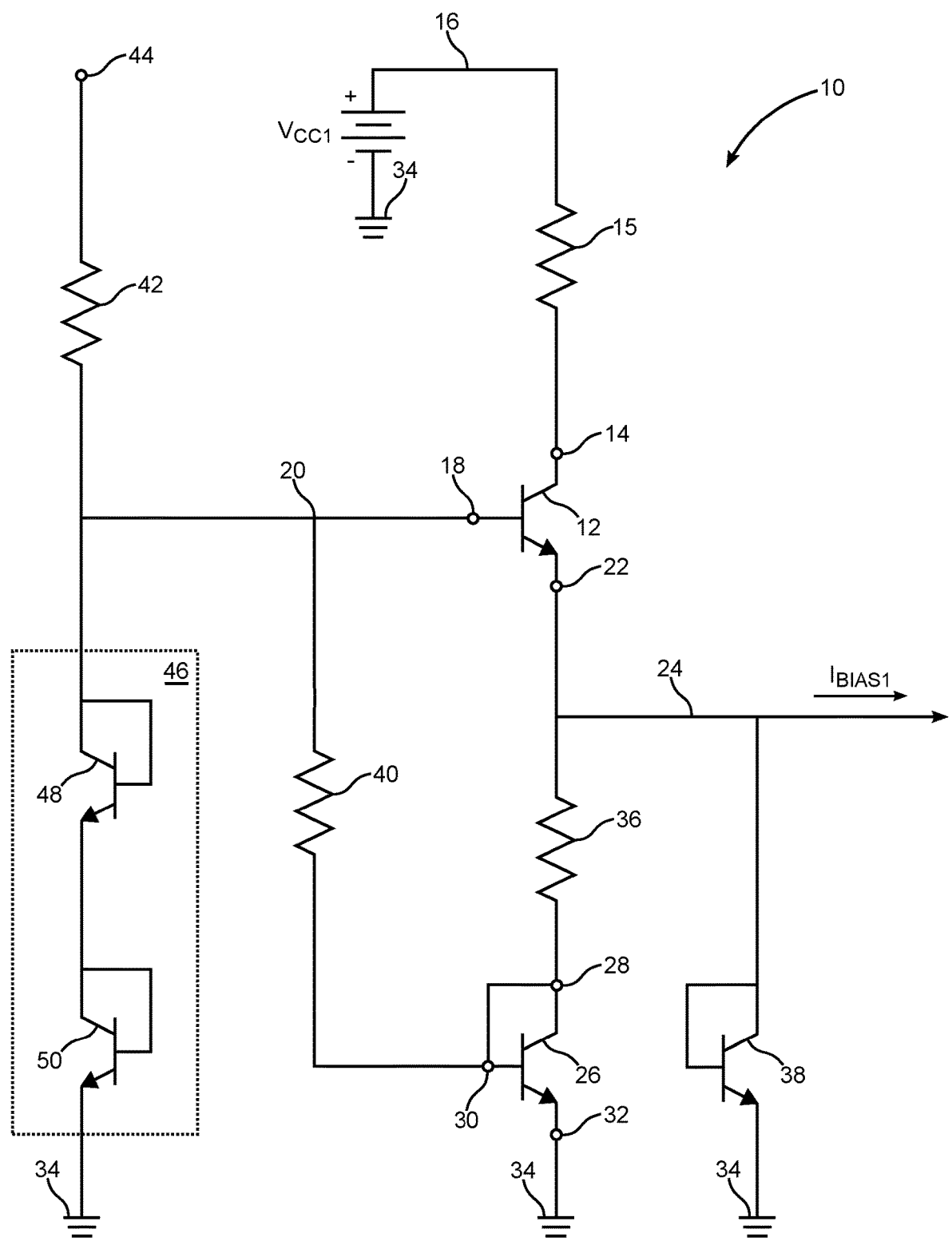
FIG. 1 is a schematic of an exemplary embodiment of bias circuitry that is structured in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a schematic of an exemplary embodiment of bias circuitry 10 that is structured in accordance with the present disclosure. The bias circuitry 10 includes a bias drive device 12 having a first current terminal 14 coupled through a stabilizer resistor 15 to a first voltage supply node 16, a bias control terminal 18 coupled to a control node 20, and a second current terminal 22 coupled to a bias output node 24. In the exemplary embodiment depicted in FIG. 1, the first voltage supply node 16 is energized by a first voltage source $V_{CC1}$. A bias current $I_{BIAS1}$ flows from the bias output node 24 to a radio frequency power transistor (not shown).

An impedance control device 26 has a third current terminal 28 and an impedance control terminal 30 that are coupled together, and a fourth current terminal 32 coupled to a fixed voltage node 34. An output impedance resistor 36 is coupled between the third current terminal 28 and the bias output node 24. A pull-down device 38 is coupled between the bias output node 24 and the fixed voltage node 34.

An impedance setpoint resistor 40 is coupled between the impedance control terminal 30 and the control node 20 and is scaled in resistance such that a higher voltage applied to the control node 20 sets an output impedance at the bias output node 24 to approximately equal to a lower impedance of the pull-down device 38 in parallel with the impedance from device 12, and a lower voltage applied to the control node 20 sets the output impedance to approximately equal to the resistance of the output impedance resistor 36.

A current limiter 42 is coupled between an external control terminal 44 and the control node 20. A voltage reference 46 is coupled between the control node 20 and the fixed voltage node 34. In the exemplary embodiment of FIG. 1, the current limiter 42 is a resistor having a resistance that is on the order of tens of ohms. The voltage reference 46 is typically a series string of diodes that are forward biased when the bias circuitry 10 is in operation. In the exemplary embodiment of FIG. 1, the series string of diodes is made up of a first diode coupled transistor 48 and a second diode coupled transistor 50.

Figure 2:
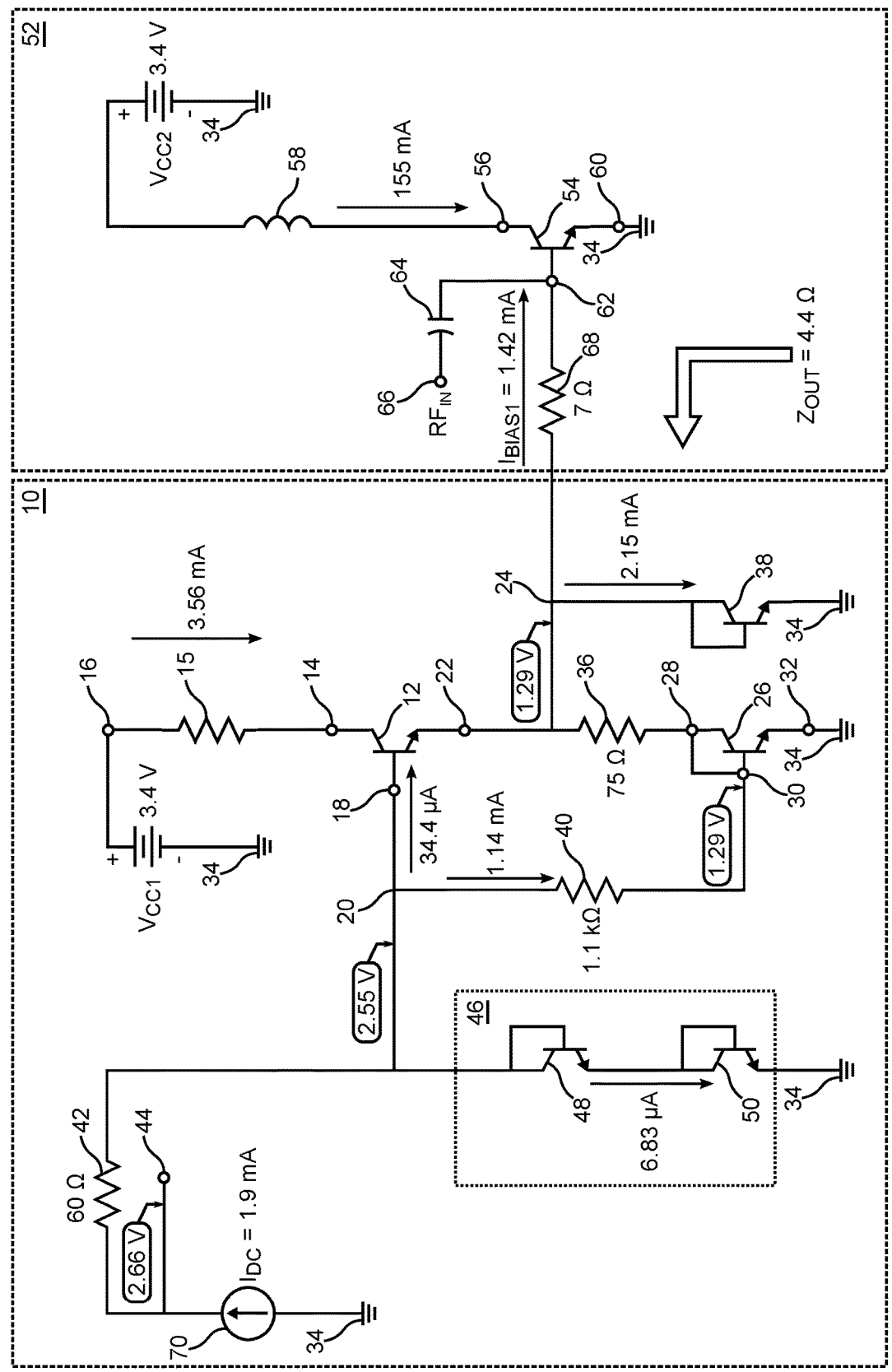
FIG. 2 is a schematic depicting an exemplary embodiment of the bias circuitry supplying bias current to a radio frequency power amplifier output stage that is shown operating in a higher output power mode.

FIG. 2 is a schematic depicting an exemplary embodiment of the bias circuitry 10 supplying bias current to a radio frequency power amplifier output stage 52 that is shown operating in a higher output power mode. The radio frequency power amplifier output stage 52 includes a power transistor 54 that has a first amplifier current terminal 56 coupled to a second voltage source $V_{CC2}$ through a radio frequency choke coil 58. The power transistor 54 also includes a second amplifier current terminal 60 that is coupled to the fixed voltage node 34. Further included is an amplifier control terminal 62 that is coupled through a radio frequency coupling capacitor 64 to a radio frequency signal input terminal 66, which is labeled $RF_{IN}$ in FIG. 2. The amplifier control terminal 62 is further coupled to the bias output node 24 through a ballast resistor 68.

In FIG. 2, exemplary current magnitudes are listed adjacent to current direction arrows, and exemplary node voltages are displayed in rounded rectangles with pointers. A relatively higher voltage is applied to the external control terminal 44 during a high power mode operation of the radio frequency power amplifier output stage 52. The relatively higher voltage at the external control terminal 44 drives a current source 70 to generate a current $I_{DC}$ that flows through the current limiter 42 and into the control node 20. Voltage at the control node 20 is high enough to place the voltage reference 46 into conduction. Current flowing into the control node 20 is also high enough to place the bias drive device 12 into conduction, which in turn places the pull-down device 38 into conduction and provides the power transistor 54 with a relatively higher bias current level. In the exemplary operation illustrated in FIG. 2, the bias current $I_{BIAS1}$ flowing into the amplifier control terminal 62 is 1.42 mA, which in turn causes a baseband collector current of 155 mA to flow through the power transistor 54. While the pull-down device 38 is in conduction, output impedance $Z_{OUT}$ of the bias circuitry 10 in this exemplary illustration is 4.4Ω. In other exemplary embodiments, output impedance $Z_{OUT}$ is between 1Ω and 10Ω.

Figure 3:
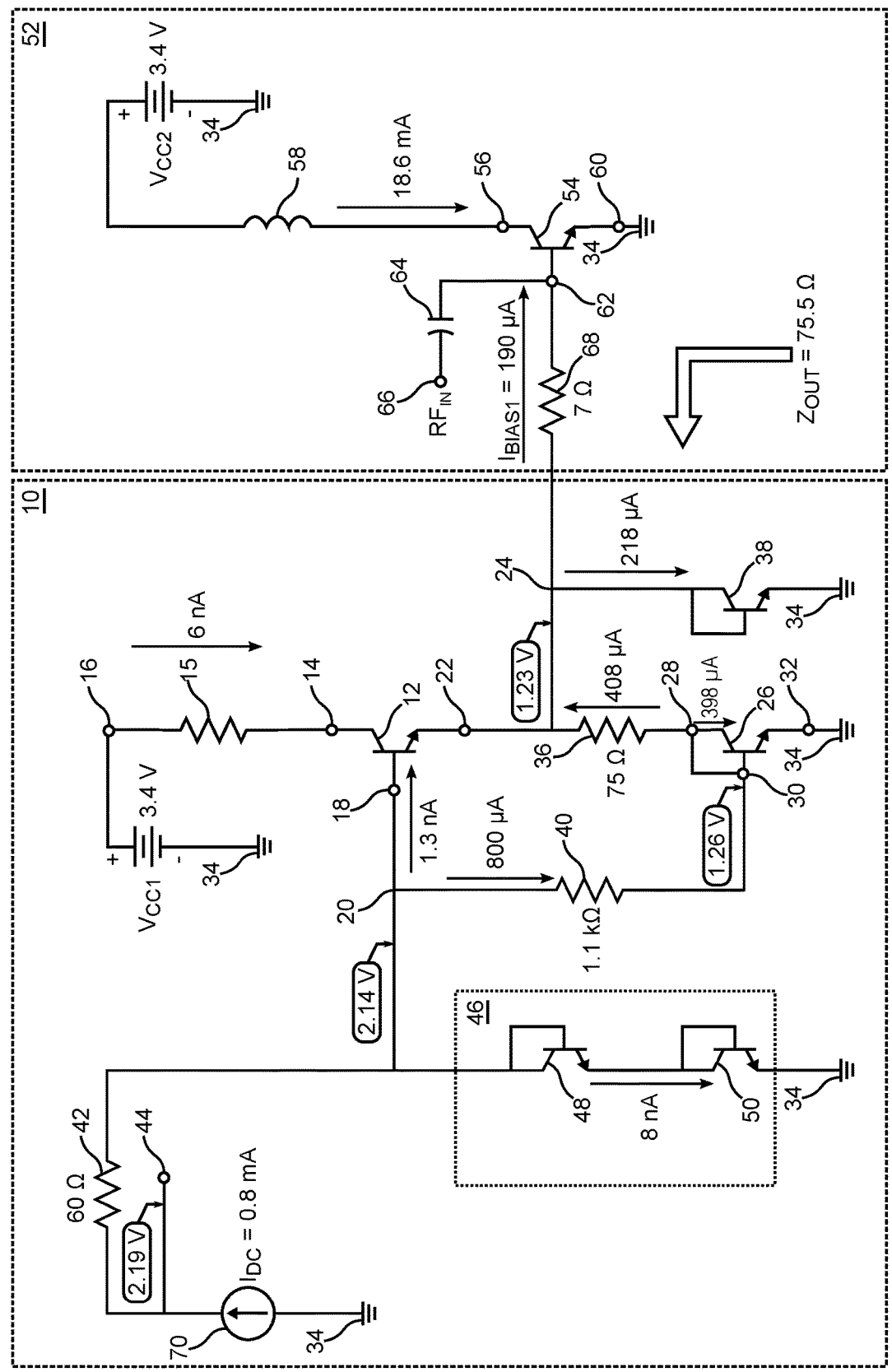
FIG. 3 is a schematic depicting the exemplary embodiment of FIG. 2 with the bias circuitry supplying bias current to the radio frequency power amplifier output stage that is shown operating in a lower output power mode.

FIG. 3 is a schematic depicting the exemplary embodiment of the bias circuitry 10 depicted in FIG. 2 with the bias circuitry 10 supplying a lower level of the bias current $I_{BIAS1}$ to the radio frequency power amplifier output stage 52 that is shown operating in a lower output power mode. When a lower voltage is applied to the external control terminal 44, a lower current level is sourced from the current source 70. This lower current flowing into the control node 20 is not enough to drive the voltage reference 46 into conduction. As such, the pull-down device 38 is also not placed into conduction. Thus, output impedance of the bias circuitry 10 is approximately equal to the resistance of the output impedance resistor, which in this exemplary embodiment is 75Ω. In other embodiments, the resistance of the output impedance resistor 36 is between 200% and 1000% greater than the lower impedance of the pull-down device 38.

A lower level of the bias current $I_{BIAS1}$ falls to around 190 μA in the exemplary operation illustrated in FIG. 3. This lower level of 190 μA, which in turn causes a relatively lower baseband collector current of 18.6 mA to flow through the power transistor 54.

FIG. 4 is a schematic of an exemplary embodiment of a radio frequency power amplifier system 72 that employs the bias circuitry 10. The radio frequency power amplifier system 72 includes the includes a driver amplifier stage 74 that is coupled in series with the radio frequency power amplifier output stage 52 between an input port P1 and an output port P2.

Typically, an impedance matching network 76 is coupled between the first amplifier current terminal 56 and the output port P2 to provide impedance matching to a load such as an antenna 78. The driver amplifier stage 74 includes a driver transistor 80 that has a first driver current terminal 82 coupled to the first voltage source $V_{CC1}$ through a second radio frequency choke coil 84. The driver transistor 80 also includes a second driver current terminal 86 that is coupled to the fixed voltage node 34. Further included is a driver control terminal 88 that is coupled through a second radio frequency coupling capacitor 90 to the first port P1. The driver control terminal 88 is further coupled to a second ballast resistor 92.

The driver amplifier stage 74 drives the radio frequency power amplifier output stage 52 through a third radio frequency coupling capacitor 94, which is coupled between the first driver current terminal 82 and the radio frequency signal input terminal 66. A filter inductor 96 is coupled between an inner node 98 and the fixed voltage node 34. During operation, the radio frequency coupling capacitor 64, the third radio frequency coupling capacitor 94, and the filter inductor 96 function as a high-pass T-filter.

A fixed impedance bias circuitry 100 is configured to generate a second bias current $I_{BIAS2}$ to provide bias to the driver transistor 80. The fixed impedance bias circuitry 100 includes a second bias drive device 102 having a first device current terminal 104 coupled to the first voltage source $V_{CC1}$ and a second device current terminal 106 coupled to the driver control terminal 88 through the second ballast resistor 92. A device control terminal 108 is coupled to a reference voltage node 110.

A second current limiter 112 is coupled between a second external control terminal 114 and the reference voltage node 110. A second voltage reference 116 is coupled between the reference voltage node 110 and the fixed voltage node 34. In the exemplary embodiment of FIG. 4, the second current limiter 112 is a resistor having a resistance that is on the order of tens of ohms. The second voltage reference 116 is typically a series string of diodes that are forward biased when the bias circuitry 10 is in operation. In the exemplary embodiment of FIG. 4, the series string of diodes is made up of a third diode coupled transistor 118 and a fourth diode coupled transistor 120.

A digital-to-analog converter 122 has a first converter output 124 that is coupled to the external control terminal 44 of the bias circuitry 10. The digital-to-analog converter 122 also has a second converter output 125 that is coupled to the second external control terminal 114 of the fixed impedance bias circuitry 100. A baseband processor (not shown) provides digital values through an N number of bits to the digital-to-analog converter 122. A first digital value is converted into a first analog voltage that is applied to the external control terminal 44 of the bias circuitry 10. A second digital value is converted to a second analog voltage that is applied to the second external control terminal 114 of the fixed impedance bias circuitry 100. When the radio frequency power amplifier system 72 is operating in a lower power mode, the baseband controller provides the digital-to-analog converter 122 with a relatively lower digital value. In contrast, when the radio frequency power amplifier system 72 is operating in a higher power mode, the baseband controller provides the digital-to-analog converter 122 with a relatively higher digital value. The digital-to-analog converter 122 may be fabricated using complementary metal oxide semiconductor technology.

FIG. 5 depicts a circuit die 126 that offers an advantage of the bias circuitry 10 providing a reduced physical size for the radio frequency power amplifier system 72. In particular, the bias circuitry 10 allows the radio frequency power amplifier system 72 to be integrated onto the circuit die 126 without a need to include a gain reduction circuit (not shown). This elimination of the typically needed gain reduction circuit removes the need for at least one of a plurality of input/output (I/O) bumps 128. As such, in an exemplary embodiment the circuit die 126 may be fabricated with reduced dimensions that are less than 600×810 microns. Moreover, the circuit die generally has dimensions that are substantially less than typical circuits that do not employ the bias circuitry 10. The circuit die may be fabricated with gallium arsenide technology.

Those skilled in the art will recognize improvements and modifications to the preferred embodiments of the present disclosure. All such improvements and modifications are considered within the scope of the concepts disclosed herein and the claims that follow.

What is claimed is:

1. Bias circuitry comprising:
 a bias drive device having a first current terminal coupled to a first voltage supply node, a bias control terminal coupled to a control node, and a second current terminal coupled to a bias output node;
 an impedance control device having a third current terminal and an impedance control terminal that are coupled together and a fourth current terminal coupled to a fixed voltage node;
 an output impedance resistor coupled between the third current terminal and the bias output node; and
 a pull-down device coupled between the bias output node and the fixed voltage node, wherein a higher voltage applied to the control node sets an output impedance at the bias output node to approximately equal to a lower impedance of the pull-down device in parallel with the bias drive device and a lower voltage applied to the control node sets the output impedance at the bias output node to approximately equal to resistance of the output impedance resistor.

2. The bias circuitry of claim 1 further including an impedance setpoint resistor coupled between the impedance control terminal and the control node.

3. The bias circuitry of claim 1 further including a current limiter coupled between an external control terminal and the control node.

4. The bias circuitry of claim 1 further including a voltage reference coupled between the control node and the fixed voltage node.

5. The bias circuitry of claim 4 wherein the fixed voltage node is ground.

6. The bias circuitry of claim 4 wherein the voltage reference comprises at least one diode.

7. The bias circuitry of claim 6 wherein the at least one diode is a bipolar junction transistor coupled in a diode configuration.

8. The bias circuitry of claim 1 wherein the pull-down device is a bipolar junction transistor coupled in a diode configuration.

9. The bias circuitry of claim 1 wherein the bias drive device is a bipolar junction transistor having a collector coupled to the first current terminal, a base coupled to the bias control terminal, and an emitter coupled to the second current terminal.

10. The bias circuitry of claim 1 wherein the impedance control device is a bipolar junction transistor having a collector coupled to the third current terminal, a base coupled to the impedance control terminal, and an emitter coupled to the fourth current terminal.

11. The bias circuitry of claim 1 wherein the lower impedance of the pull-down device is between 1Ω and 10Ω.

12. The bias circuitry of claim 11 wherein resistance of the output impedance resistor is between 200% and 1000% greater than the lower impedance of the pull-down device.

13. A radio frequency amplifier system comprising:
   a power transistor having an amplifier control terminal coupled to a bias output node; and
   bias circuitry comprising:
      a bias drive device having a first current terminal coupled to a first voltage supply node, a bias control terminal coupled to a control node, and a second current terminal coupled to the bias output node;
      an impedance control device having a third current terminal and an impedance control terminal that are coupled together and a fourth current terminal coupled to a fixed voltage node;
      an output impedance resistor coupled between the third current terminal and the bias output node; and
      a pull-down device coupled between the bias output node and the fixed voltage node, wherein a higher voltage applied to the control node sets an output impedance at the bias output node to approximately equal to a lower impedance of the pull-down device in parallel with the bias drive device and a lower voltage applied to the control node sets the output impedance at the bias output node to approximately equal to resistance of the output impedance resistor.

14. The radio frequency amplifier system of claim 13 further including an impedance setpoint resistor coupled between the impedance control terminal and the control node.

15. The radio frequency amplifier system of claim 13 further including a voltage reference coupled between the control node and ground.

16. The radio frequency amplifier system of claim 13 further including a current limiter coupled between an external control terminal and the control node.

17. The radio frequency amplifier system of claim 16 further including a digital-to-analog converter having a converter output coupled to the external control terminal.

18. The radio frequency amplifier system of claim 13 wherein the power transistor and the bias circuitry are integrated within a circuit die.

19. The radio frequency amplifier system of claim 18 wherein the circuit die has dimensions that are less than 600×810 microns.

20. The radio frequency amplifier system of claim 18 wherein the circuit die is fabricated with gallium arsenide technology.

* * * * *